United States Patent [19]

Stockmeier et al.

[11] Patent Number: 5,449,938
[45] Date of Patent: Sep. 12, 1995

[54] MOS-CONTROLLED POWER SEMICONDUCTOR COMPONENT

[75] Inventors: Thomas Stockmeier, Baden-Dättwil, Switzerland; Uwe Thiemann, Wutöschingen, Germany

[73] Assignee: ABB Management Ltd., Baden, Switzerland

[21] Appl. No.: 194,464

[22] Filed: Feb. 8, 1994

[30] Foreign Application Priority Data

Mar. 18, 1993 [DE] Germany .......... 43 08 624.1

[51] Int. Cl.⁶ .......... H01L 29/06; H01L 29/78
[52] U.S. Cl. .......... 257/356; 257/358; 257/363; 257/328; 257/646; 257/651
[58] Field of Search .......... 257/646, 651, 356, 355, 257/358, 359, 360, 363, 905, 328

[56] References Cited

U.S. PATENT DOCUMENTS

| 4,375,125 | 3/1983 | Byatt .......... 257/646 |
| 4,492,974 | 1/1985 | Yoshida et al. .......... 257/328 |
| 4,618,871 | 10/1986 | Mitlehner .......... 257/646 |
| 4,963,970 | 10/1990 | Throngnumchai et al. .......... 257/328 |
| 5,220,443 | 6/1993 | Noguchi .......... 257/328 |
| 5,324,971 | 6/1994 | Notley .......... 257/328 |

FOREIGN PATENT DOCUMENTS 2834759 2/1979 Germany .
3229250 7/1983 Germany .

OTHER PUBLICATIONS

Proceedings of the IEEE, vol. 76, No. 4, B. Jayant Baliga, "Evolution of MOS–Bipolar Power Semiconductor Technology", Apr. 1988, pp. 409–418.
IEEE Transactions on Electron Devices, vol. ED-33, No. 10, Victor A. K. Temple, "MOS-Controlled Thyristors–A New Class of Power Devices", Oct. 1986, pp. 1609–1617.

Primary Examiner—Sara W. Crane
Assistant Examiner—Alice W. Tang
Attorney, Agent, or Firm—Oblon, Spivak, McClelland, Maier & Neustadt

[57] ABSTRACT

A power semiconductor component having integrated protection against electrostatic destruction is published. Such a semiconductor component (1) comprises a semiconductor substrate (10) having at least one MOS structure whose gate (7) is arranged insulated from the semiconductor substrate (10). Such structures are susceptible to destruction by a dielectric breakdown of the insulation layer, caused by electrostatic charging. According to the invention, this insulating layer between the gate electrode (3) and the main electrode (2) is now replaced by a semi-insulating layer (9) so that a limited current flow becomes possible between the gate (7) and the main electrode (2) and it is no longer possible for any potential difference to build up.

18 Claims, 1 Drawing Sheet

MOS-CONTROLLED POWER SEMICONDUCTOR COMPONENT

BACKGROUND OF THE INVENTION

1. Field of the Invention

The invention relates to the field of power electronics. It is based on an MOS-controlled power semiconductor component.

2. Discussion of Background

Such a power semiconductor component has already been described as an MCT (MOS-controlled thyristor) in the article by V.A.K. Temple ("MOS-Controlled Thyristors—A New Class of Power Devices", IEEE Trans. on Electron Devices, Vol. ED-33, No. 10, Oct. 1986), and as an IGBT (Insulated Gate Bipolar Transistor) in the article by B.J. Baliga ("Evolution of MOS Bipolar Power Semiconductor Technology", Proceedings of the IEEE, Vol. 76, No. 4, Apr. 1988).

MOS-controlled power semiconductor components comprise a semiconductor substrate having at least one MOS structure. The current flow from a first main electrode to a second main electrode can be switched on and off by applying a voltage to the gate electrode of the MOS structure.

The gate is arranged such that it is insulated from the semiconductor substrate by a so-called gate oxide layer. The insulation to the metallization of the main electrode is effected by means of one or more insulation layers (for example silicon oxide) between the gate and the metallization.

This insulation of the control gate results in it being possible for the component to be destroyed by dielectric breakdown of the insulation oxide, caused by electrostatic charging. This can occur even during the manufacture of the components, but also in the subsequent testing and installation phase or during operation. The defect always leads to a total loss of the functional characteristics.

SUMMARY OF THE INVENTION

Accordingly, one object of the invention is to provide a novel MOS-controlled power semiconductor component which cannot be destroyed by dielectric breakdowns. The component is nevertheless intended to be constructed as simply as possible.

It is thus the essence of the invention to provide means for protection of the semiconductor component against destruction by dielectric breakdowns, which means are arranged directly between the metallization of the main electrode and the gate layer.

In a preferred exemplary embodiment, these means comprise a semi-insulating layer. This semi-insulating layer preferably has a current/voltage characteristic of the varistor type.

The advantage of the construction according to the invention is thus that the semiconductor component has integrated protection against destruction by dielectric breakdowns. Since the means for protection at the same time represent the isolation of the gate electrode and the main electrode, no additional process steps or masks are required.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

Figure 1:
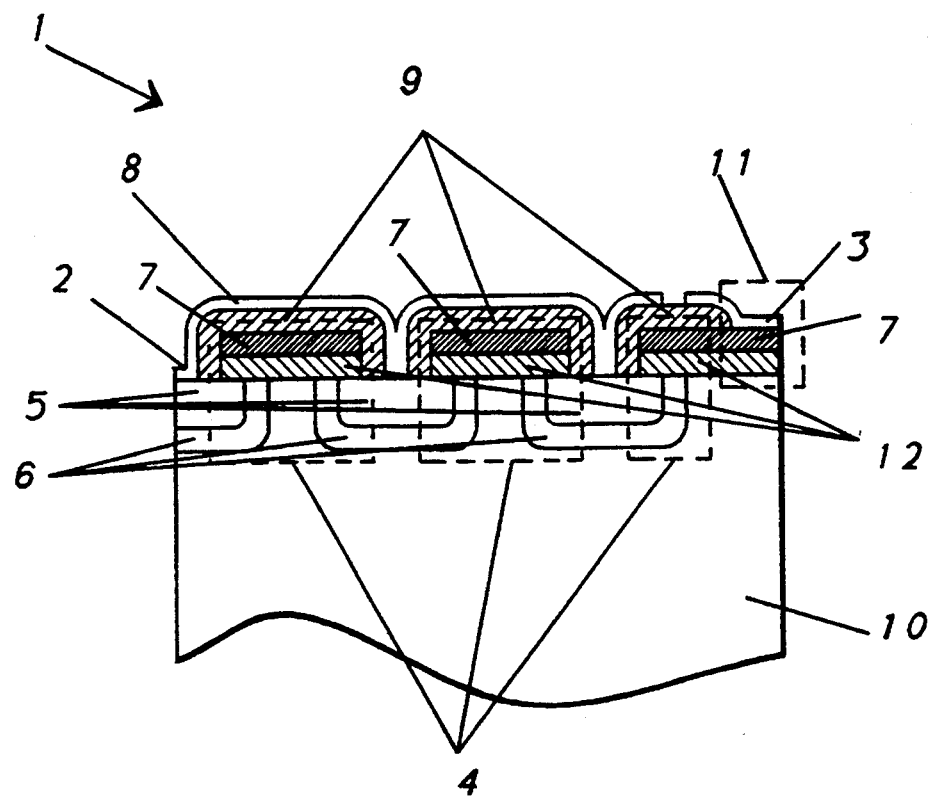
FIG. 1 shows a section of an MOS-controlled power semiconductor component according to the invention, in section.

The reference designations used in the drawings and their meaning are listed in summarized form in the List of Designations.

DESCRIPTION OF THE PREFERRED EMBODIMENTS

Referring now to the drawings, wherein like reference numerals designate identical or corresponding parts throughout the several views, FIG. 1 shows in section a section of an MOS-controlled power semiconductor component (1) according to the invention. Such a semiconductor component comprises a semiconductor substrate (10) having a plurality of recessed MOS structures (4). A gate electrode (3) is arranged over the semiconductor substrate (10). The current flow between the two main electrodes can be switched on and off by applying a voltage to the gate electrode. Of the main electrodes, one is located on the surface illustrated of the semiconductor substrate and the other is on the opposite surface, which is not illustrated.

The MOS structures (4) comprise a well (5), which is diffused into the semiconductor substrate (10), and a channel region (6) surrounding this well (5). The well (5) and semiconductor substrate (10) are in general of the same conductance type, while the channel region is of the opposite conductance type. The gate electrode (3) is formed by a conductive layer (7) which extends from one well (5) over the associated channel region (6), the semiconductor substrate (10) being located between two MOS structures, and over the adjacent channel region of the adjacent well (5). The insulation between gate layer (7), the semiconductor substrate (10) and the main electrode (2) is formed by a layer (9) surrounding the gate layer (7). The gate layer (7) is insulated from the semiconductor substrate (10) by a gate oxide (12) which is located directly between the gate layer (7) and the semiconductor substrate (10). The main electrode (2) is constructed as a metal layer (8) which covers the insulating layer (9) and makes contact with the semiconductor substrate (10) in those regions of the wells (5), the contact holes, which are not covered by the gate layer (7).

The gate layer is exposed at a point in the gate contact region (11), and the gate electrode (3) makes contact with the conductive gate layer (7).

According to the prior art, the gate layer (7) is formed, for example, by a polysilicon layer. However, the surrounding layer (9) is composed of an insulating material, especially of silicon oxide. This insulation of the control gate results in it being possible for the component to be destroyed by dielectric breakdown of the insulation oxide caused by electrostatic charging. Simple touching, for example, is sufficient to produce such charging. The damage is always irreparable, and a damaged element can no longer be used.

The aim of the invention is to produce a limited conduction capability between the main electrode and the gate electrode. This is achieved in that the insulation oxide is replaced by a semi-insulating layer (9). As a result of the limited current flow between the gate and the main electrode, the build-up of a potential difference between the gate and the main electrode is rendered impossible. It is thus no longer possible to destroy the component by electrostatic charging.

The contact between the gate (3) and the main electrode (2) is formed since both the metallization (8) of the main electrode and the conductive layer (7) of the gate electrode make contact laterally with the semi-insulating layer in the contact holes.

In the manufacturing process, the semi-insulating layer (9) replaces the insulation layer between the gate and the main electrode. Thus, no additional process steps or photo masks are required. If the same semi-insulating layer (9) is also used for passivating the edge termination, then, in contrast, not only masks but also a series of process steps can be saved.

Figure 2:
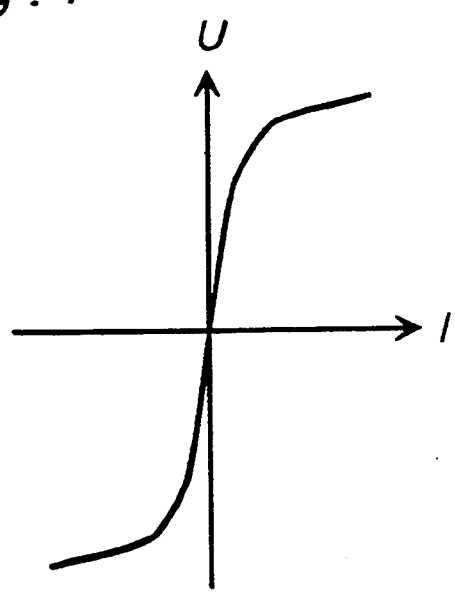
FIG. 2 shows the current/voltage characteristic of the semi-insulating layer according to the invention.

The semi-insulating layer (9) is distinguished by a non-linear current/voltage behavior, such as that which, for example, varistors have (see FIG. 2). Above a specific voltage, for example approximately 20 V, the current increases more than in proportion, as a result of which voltage limiting occurs. Such a behavior can be produced, for example, using polysilicon containing oxygen (SIPOS). The resistivity can typically be varied between $10^6$ Ωcm and $10^9$ Ωcm, by means of the oxygen content in the SIPOS layer. In one extreme case, pure polysilicon is obtained, and silicon oxide in the other extreme case. The SIPOS layer is preferably applied in a low-pressure chemical vapor deposition process (LPCVD) or a plasma-enhanced chemical vapor deposition process (PECVD).

The semiconductor substrate (10) normally comprises a plurality of layers of different doping. In particular, it has the structure of a power MOSFET, of an MCT, of an IGBT or of another MOS-controlled power semiconductor component.

In the case of an experimentally constructed component, it was found that the leakage current between the gate and the main electrode, measured at an applied voltage of 10 V, rose from $10^{-9}$ A to $10^{-8}$ A, in comparison with a component having an insulation layer. The yield of the functional component was in this case over 80% on average, which is considerably more than in the case of the previous components.

Thus, overall, the invention makes available an MOS-controlled power semiconductor component which has protection against dielectric breakdowns and can nevertheless be manufactured easily.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by letters patent of the United States is:

1. An MOS-controlled power semiconductor component (1) comprising:
   a) a semiconductor substrate (10), having at least one MOS structure (4),
   b) a conductive gate layer (7), which is insulated from the semiconductor substrate (10), being arranged over the substrate (10), and it being possible to switch the semiconductor component (1) on and off by applying a voltage to a gate electrode (3) which is connected to the gate layer (7);
   c) a main electrode (2) being in contact with the semiconductor substrate (10), being arranged over the gate layer (7), and being formed by a metallization (8); wherein
   d) means are provided for protection against destruction of the semiconductor component (1) by dielectric breakdowns between the metallization (8) of the main electrode (2) and the gate layer (7);
   e) said means comprising a semi-insulating layer (9) surrounding and covering the gate layer (7) and being covered by the metallization (8) of the main electrode (2).

2. The semiconductor component as claimed in claim 1, wherein the gate electrode (3) makes contact with the conductive gate layer (7) in a gate-contact region (11) which is not covered by the semi-insulating layer (9).

3. The semiconductor component as claimed in claim 2, wherein
   a) the MOS structure (4) comprises a well (5) which extends into the semiconductor substrate (10) and is surrounded by a channel region (6);
   b) the main electrode (2) is in contact with the well (5); and
   c) the conductive gate layer (7) extends from the well (5) over an associated channel region (6), the semiconductor substrate (10) located between two adjacent MOS structures (4), and over an adjacent channel region (6) to an adjacent well (5) located alongside it.

4. The semiconductor component as claimed in claim 3, wherein the semiconductor substrate (10) comprises a plurality of layers of different doping.

5. The semiconductor component as claimed in claim 4, wherein the semiconductor substrate has a structure selected from the group consisting of a power MOSFET, an MCT, or an IFBT.

6. The semiconductor component as claimed in claim 1, wherein the semi-insulating layer (9) has a non-linear current/voltage characteristic of a varistor.

7. The semiconductor component as claimed in claim 6, wherein the semi-insulating layer (9) is composed of polysilicon containing oxygen.

8. The semiconductor component as claimed in claim 7, wherein a resistivity of the semi-insulating layer (9) is approximately $10^9$ Ωcm.

9. The semiconductor component as claimed in claim 8, wherein the semi-insulating layer (9) is formed by means of a method selected from the group consisting of a low-pressured chemical vapor deposition process or a plasma-enhanced chemical vapor deposition process.

10. An MOS-controlled power semiconductor component comprising:
    a semiconductor substrate, having at least one MOS structure;
    a conductive gate layer, which is insulated from the semiconductor substrate, arranged over the substrate, the semiconductor component being switched on and off by applying a voltage to a gate electrode which is connected to the gate layer;
    a main electrode in contact with the semiconductor substrate, and arranged over the gate layer, and being formed by a metallization;
    a semi-insulating layer surrounding and covering the gate layer and being covered by the metallization of the main electrode, for protection against destruction of the semiconductor component by dielectric breakdowns between the metallization of the main electrode and the gate layer.

11. The semiconductor component as claimed in claim 10, wherein the gate electrode makes contact with the conductive gate layer in a gate-contact region which is not covered by the semi-insulating layer.

12. The semiconductor component as claimed in claim 11, wherein
the MOS structure comprises a well which extends into the semiconductor substrate and is surrounded by a channel region;
the main electrode is in contact with the well; and
the conductive gate layer extends from the well over an associated channel region, the semiconductor substrate located between two adjacent MOS structures, and over an adjacent channel region to an adjacent well.

13. The semiconductor component as claimed in claim 12, wherein the semiconductor substrate comprises a plurality of layers of different doping.

14. The semiconductor component as claimed in claim 13, wherein the semiconductor substrate has a structure selected from the group consisting of a power MOSFET, an MCT, or an IGBT.

15. The semiconductor component as claimed in claim 10, wherein the semi-insulating layer has a non-linear current/voltage characteristic.

16. The semiconductor component as claimed in claim 15, wherein the semi-insulating layer is composed of polysilicon containing oxygen.

17. The semiconductor component as claimed in claim 16, wherein a resistivity of the semi-insulating layer is approximately $10^9$ $\Omega$cm.

18. The semiconductor component as claimed in claim 17, wherein the semi-insulating layer is formed by a method selected from the group consisting of a low-pressure chemical vapor deposition process or a plasma-enhanced chemical vapor deposition process.

* * * * *